United States Patent [19]

Simopoulos

[11] Patent Number: 5,777,519
[45] Date of Patent: Jul. 7, 1998

[54] HIGH EFFICIENCY POWER AMPLIFIER

[76] Inventor: Anastasios V. Simopoulos, 2 Otis Pratt La., Middleboro, Mass. 02346

[21] Appl. No.: 683,172

[22] Filed: Jul. 18, 1996

[51] Int. Cl.[6] .................................................. H03F 3/04
[52] U.S. Cl. .................................................. 330/297
[58] Field of Search .......................... 330/85, 136, 285, 330/297; 323/265, 266, 280

[56] References Cited

U.S. PATENT DOCUMENTS 4,507,619  3/1985  Dijkstra et al. .................. 330/297
5,396,174  3/1995  Williamson et al. .............. 330/297

OTHER PUBLICATIONS

Harris Semiconductor, "Class–D Audio II Evaluation Board (HIP4080AEVAL2)", by George E. Danz, Oct., 1995, No. AN9525.1, pp. 1–16.

Harris Semiconductor, "A DC–AC Isolated Battery Inverter Using the HIP4082", by George E. Danz, No. AN95xx, pp. 1–16.

Harris Semiconductor, "High Frequency Power Converters", by Rudy Severns, Apr., 1994, No. AN9208.

*Primary Examiner*—Steven Mottola
*Attorney, Agent, or Firm*—Cesari and McKenna, LLP

[57] ABSTRACT

A high efficiency power amplifier system receives an unregulated voltage signal and an input signal $V_{in}$, and conditions the unregulated voltage signal to provide a regulated output signal whose magnitude depends on the value of the input signal $V_{in}$. The system includes a control circuit which detects changes in the input signal $V_{in}$ and the regulated output signal, and provides a feedback signal to a variable output switching regulator, which controls the regulated output signal value to maintain a predetermined relationship between the input signal $V_{in}$ and the regulated output signal. Significantly, controlling the regulated output signal such that it maintains the predetermined relationship with the input signal $V_{in}$ allows the power amplifier system to provide the regulated voltage signal directly to the electrical load. The control circuit monitors $V_{in}$ and the regulated output, and as either signal changes the control circuit provides the feedback control signal to the variable output switching regulator in order to drive $V_{out}$ such that the predetermined relationship (e.g., $V_{out}$=constant*$V_{in}$) is maintained. Providing $V_{out}$ in this manner substantially reduces the power dissipation of the power amplifier system.

18 Claims, 9 Drawing Sheets

HIGH EFFICIENCY POWER AMPLIFIER

DESCRIPTION

1. Technical Field

The present invention relates to power amplifiers, and in particular to a voltage regulation technique for reducing the power dissipation and increasing the power density in a power amplifier system.

2. Background of the Invention

Power operational amplifiers are well known in the field of electronics and are often used to drive electrical loads such as audio speakers and motors. In general, when operating as a driver, an operational amplifier must deliver a specified amount of signal power to the load with an acceptably low level of signal distortion.

FIG. 1 illustrates a functional block diagram of a prior art power amplifier system 10. The system includes a dual voltage power supply 12 which receives an unregulated supply signal (e.g., 120 VAC, 60 Hz) on a line 14, and as known, converts the unregulated signal to regulated, constant value, voltage signals $V_{cc}$ and $-V_{cc}$ which are provided on lines 16, 18 respectively. The system also includes a power operational amplifier 20 which receives an input signal $V_{in}$ on a line 22, and provides an output signal value $V_{out}$ on a line 24 to an electrical load 26. The operational amplifier is powered by the regulated voltage signal values $V_{cc}$ and $-V_{cc}$ on line 16, 18 and has a gain K, such that $V_{out}$ is equal to $K*V_{in}$.

A power operational amplifier configured to operate as a driver generally has a broad operating range in order to properly drive/control the electrical load over its dynamic range. For example, the range of the output signal value $V_{out}$ may span from minus twelve (−12) volts DC up to twelve (12) volts DC. In order for the operational amplifier to provide the full range of required drive voltages, the magnitude of the regulated voltage signal values $V_{cc}$ and $-V_{cc}$ must be larger than the magnitude of the maximum value the output signal $V_{out}$ is capable of assuming.

In prior art systems, $V_{cc}$ and $-V_{cc}$ are constant values with magnitudes that are slightly greater than the maximum magnitude required for the output signal $V_{out}$. A problem with these prior art systems is that the values of $V_{cc}$ and $-V_{cc}$ remain constant despite the value of $V_{out}$. Therefore, the voltage difference between $V_{cc}$ and $V_{out}$ must be dropped across the operational amplifier circuit 20 (FIG. 1).

As the difference between $V_{cc}$ and $V_{out}$ increases, the voltage dropped across the amplifier increases, thus decreasing the efficiency of the system. As known, energy associated with the voltage dropped across the operational amplifier is converted to heat. Consequently, the system must employ thermal management techniques (e.g., active cooling and/or heat sinks) to remove this heat in order to maintain the operational amplifier and the surrounding electrical devices within their recommended temperature range. This often leads to an increase in the size of the power amplifier system (which decreases the power density of the system), since additional printed circuit board area must be dedicated to heat sinks to remove the heat from the operational amplifier circuit.

Therefore, there is a need for a power amplifier system having reduced power dissipation and increased power density.

SUMMARY OF THE INVENTION

An object of the present invention is to provide a power amplifier system with reduced power dissipation.

Another object is to provide a power amplifier system with increased power density.

Briefly, according to the present invention, a high efficiency power amplifier system receives an unregulated voltage signal and an input signal $V_{in}$, and conditions the unregulated voltage signal to provide a regulated output signal whose magnitude depends on the value of the input signal $V_{in}$. The system includes a control circuit which detects changes in the input signal $V_{in}$ and the regulated output signal, and provides a feedback signal to a variable output switching regulator, which controls the regulated output signal value to maintain a predetermined relationship between the input signal $V_{in}$ and the regulated output signal.

Significantly, controlling the regulated output signal such that it maintains the predetermined relationship with the input signal $V_{in}$ allows the power amplifier system to provide the regulated voltage signal directly to the electrical load. That is, a power operational amplifier with negative feedback does not have to be used to provide the regulated voltage signal value.

Specifically, the control circuit monitors $V_{in}$ and the regulated output, and as either signal changes, the control circuit provides the feedback control signal to the variable output switching regulator in order to drive $V_{out}$ such that the predetermined relationship (e.g., $V_{out}=\text{constant}*V_{in}$) is maintained. Providing $V_{out}$ in this manner substantially reduces the power dissipation of the power amplifier system.

If additional regulation is required, a power operational amplifier may be added to the system. In an alternative embodiment, the regulated output signal powers a power operational amplifier which receives the input signal $V_{in}$, and provides a drive signal to the load in response to the input signal $V_{in}$.

In one such alternative embodiment a power amplifier system includes a variable output switching regulator which receives and conditions an unregulated voltage signal to provide a regulated voltage signal $V_{cc}$. The regulated voltage signal $V_{cc}$ powers a power operational amplifier which is responsive to the input voltage signal $V_{in}$ and provides an output signal $V_{out}$ proportional thereto. This embodiment is advantageous in applications where a higher power supply rejection ratio is required, and therefore the drive signal to the electrical load is provided by the power operational amplifier. To reduce the power dissipated in this alternative embodiment system, the system includes a control circuit responsive to the regulated voltage signal $V_{cc}$ and the output signal $V_{out}$.

The control circuit provides a feedback control signal to the variable output power supply which controls the value of $V_{cc}$ to reduce the power dissipation of the system. Specifically, as $V_{out}$ changes in response to $V_{in}$, the feedback control signal is input to the variable output switching regulator which drives $V_{cc}$ to maintain the difference value $(V_{cc}-V_{out})$ equal to the predetermined value. Therefore, as $V_{out}$ varies, the switching regulator adjusts the value of $V_{cc}$ in order to maintain the difference value $(V_{cc}-V_{out})$ equal to the predetermined value. The value $(V_{cc}-V_{out})$ is indicative of the voltage dropped across the power operational amplifier circuit, so maintaining the value at a relatively low value throughout its operating range reduces the power dissipation of the system.

An advantage of the present invention is that by substantially reducing the power dissipation of the power amplifier system through its entire operating range, the number of heat sinks within the system can be reduced considerably, which in turn increases the system power density.

These and other objects, features and advantages of the present invention will become more apparent in light of the following detailed description of preferred embodiments thereof, as illustrated in the accompanying drawings.

DESCRIPTION OF A PREFERRED EMBODIMENT

Figure 1:
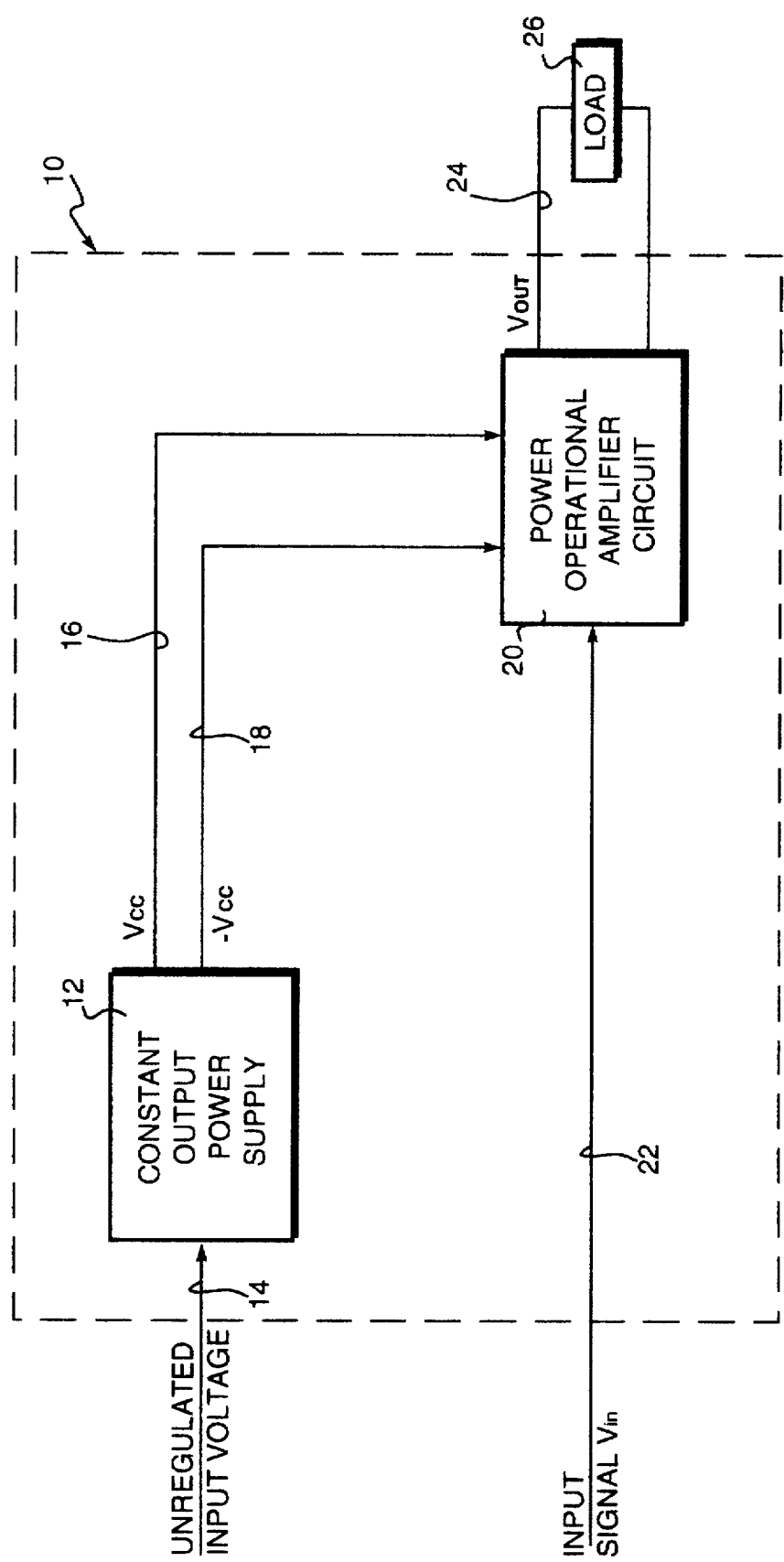
FIG. 1 is a block diagram of a prior art power amplifier system.
Figure 2:
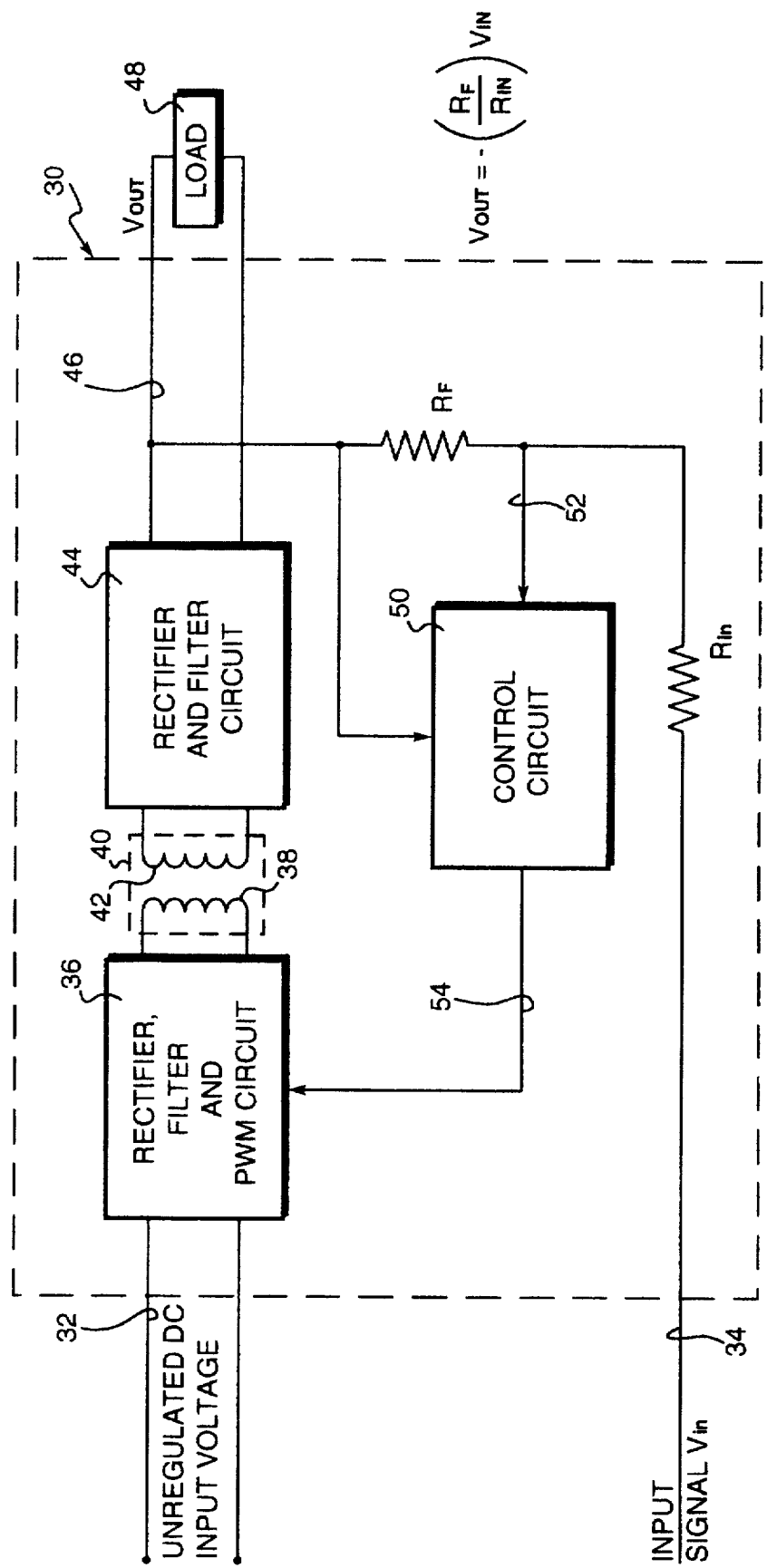
FIG. 2 is block diagram illustration of a high efficiency power amplifier system according to the present invention.

Referring to FIG. 2, a high efficiency power amplifier system 30 receives an unregulated voltage signal (e.g., 115 VAC, 60 Hz) on a line 32 and a unipolar negative input signal $V_{in}$ on a line 34. The unregulated input signal is fed to a rectifier, filter and PWM circuit 36 which rectifies and filters the signal, and in a controlled manner switches the rectified signal across a primary winding 38 of a transformer 40. This induces an electrical signal in a secondary winding 42 which is applied to a rectifier and filter circuit 44 to provide a regulated output signal $V_{out}$ on a line 46. This regulated output signal $V_{out}$ is then applied to an electrical load 48 (e.g., audio speakers or a motor). As shown, $V_{out} = -(R_f/R_{in})*V_{in}$ (note, the control circuit 50 includes a high impedance input).

According to the present invention, the control circuit 50 provides a feedback signal on a line 54 which is used by the regulator 36 to control the value of $V_{out}$ in response to changes in $V_{in}$. The operation of this system shall be discussed in more detail with reference to FIG. 3.

Figure 3:
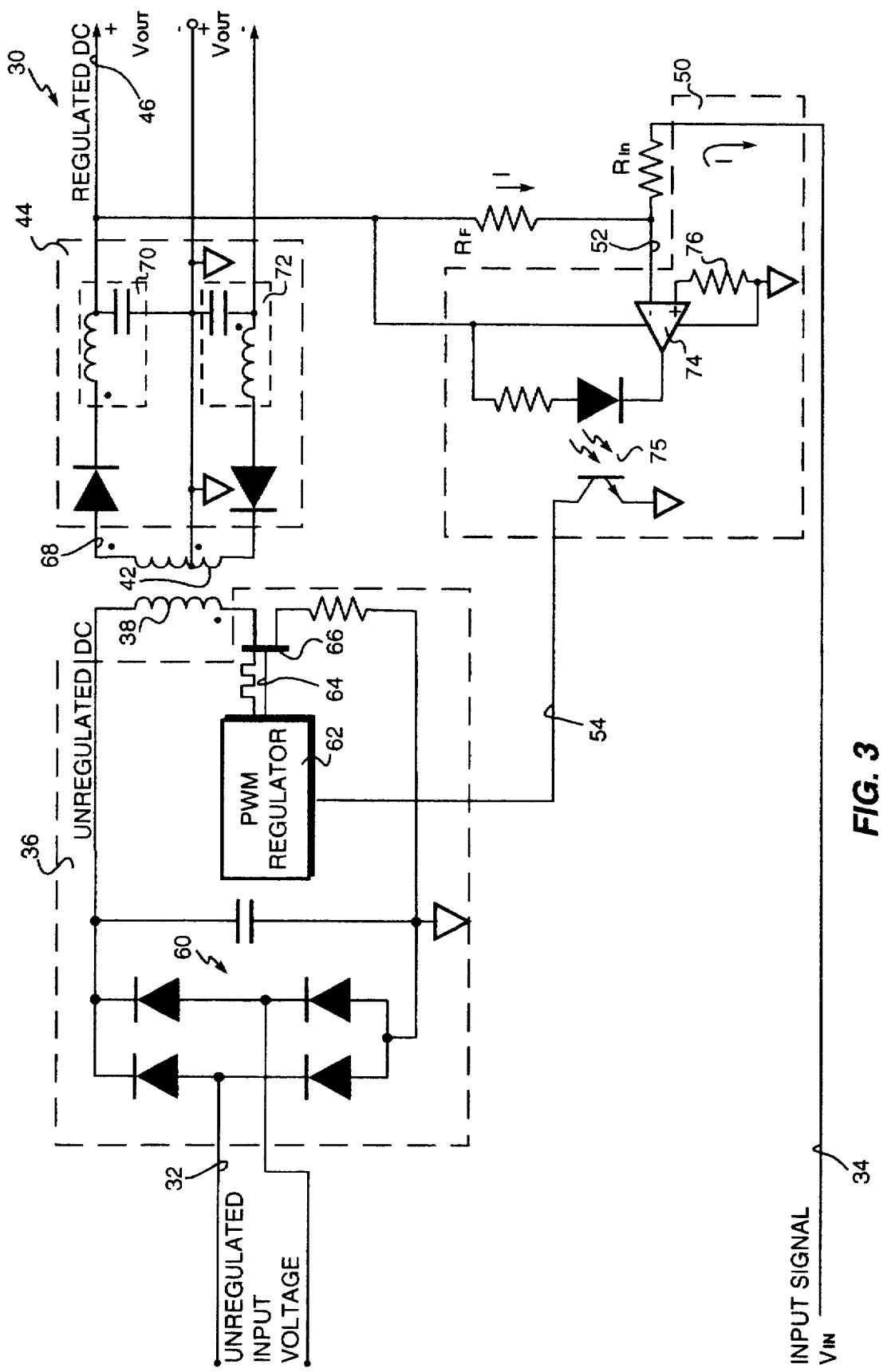
FIG. 3 is a schematic illustration of the high efficiency power amplifier system illustrated in FIG. 2.

FIG. 3 is a schematic illustration of an embodiment of the high efficiency power amplifier system 30 illustrated in FIG. 2. As shown, the rectifier, filter and PWM circuit 36 comprises a full-wave diode rectifier 60 which rectifies the AC input signal to provide the unregulated DC signal. The circuit 36 also includes a pulse-width modulation (PWM) regulator 62 which receives the feedback signal on the line 54. PWM regulators are generally available as a commercial off-the-shelf integrated circuit such as model number UC3843 available from Unitrode Corporation. In response to the feedback signal on the line 54, the PWM regulator 62 controls the pulse width of a constant frequency, periodic signal on a line 64 which controls a field-effect transistor (FET) switch 66. Switching the FET switch 66 on and off in a controlled manner generates a periodic signal on a line 68 which is rectified and filtered to provide the regulated output signal $V_{out}$ on the line 46.

To control the value of the regulated output signal $V_{out}$, the current associated with $V_{out}$ on the line 46 (i.e., $V_{out}/R_f$) and the current associated with the unipolar negative input signal $V_{in}$ on the line 34 (i.e., $V_{in}/R_{in}$), are summed on the line 52 through resistors $R_f$ and $R_{in}$, respectively. In steady state, the current flowing through $R_f$ will be equal to, but opposite in sign to the current following through $R_{in}$, and thus $V_{out}/R_f = -V_{in}/R_{in}$. As soon as $V_{in}$ changes, $V_{out}/R_f \neq -V_{in}/R_{in}$, and the feedback signal on the line 54 will change accordingly to provide a feedback signal to the PWM regulator 62 which drives $V_{out}$ so $V_{out}/R_f$ again equals $-V_{in}/R_{in}$. Specifically, when the value of the signal on the line 52 is positive, the output from the operational amplifier 74 is switched to a low voltage level, which forward biases the photodiode of opto-isolator 75. The opto-isolator 75 provides an isolated, negative feedback signal on the line 54 to the PWM regulator 62 which controls the value of $V_{out}$.

Significantly, an advantage of the system illustrated in FIG. 3 is that it operates as a high efficiency power amplifier, since the amplifier 30 only creates a voltage signal value necessary to provide the regulated output signal $V_{out}$ in response to the value of $V_{in}$. This is in contrast to the prior art discussed above, which drops voltage in order to step down to $V_{out}$. An additional advantage of the amplifier system of the present invention is that it does not require a power operational amplifier output stage. However, there are applications where a power operational amplifier output stage may be desirable in order to reduce the output ripple (e.g., noise associated with the switching frequency of the PWM regulator) on the regulated output signal $V_{out}$.

Figure 4:
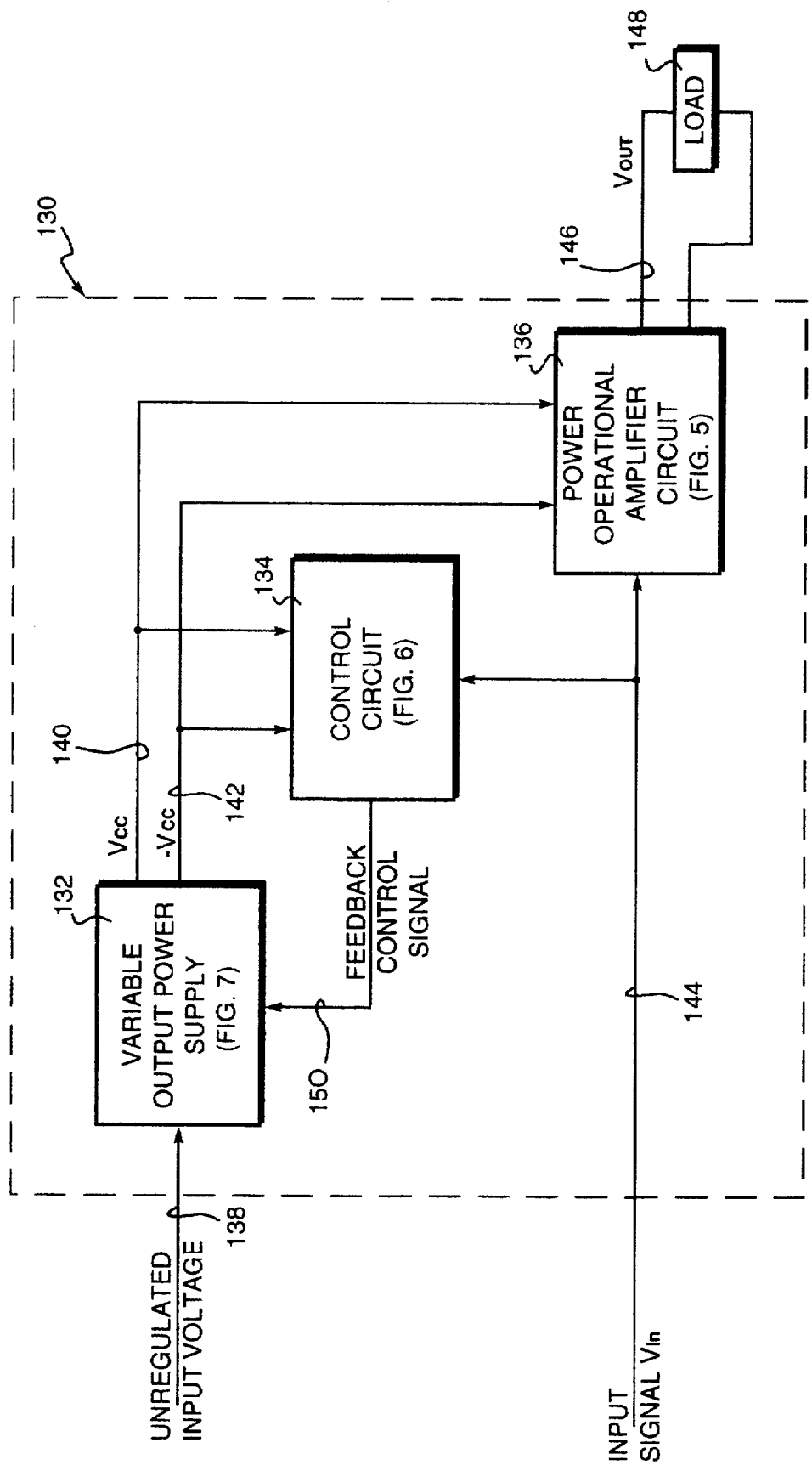
FIG. 4 is block diagram illustration of an alternative embodiment power amplifier system.

FIG. 4 is a block diagram illustration of an alternative embodiment high efficiency power amplifier circuit 130 which includes a variable output power supply 132, a control circuit 134 and a power operational amplifier circuit 136. The variable output power supply 132 receives a raw input voltage signal on a line 138 and conditions and regulates the signal to provide regulated voltage signals $V_{cc}$, $-V_{cc}$ on lines 140, 142 respectively. The regulated voltage signals $V_{cc}$, $-V_{cc}$ are applied to the power operational amplifier circuit 136 to power the amplifier circuit in a known manner. The operational amplifier circuit 136 also receives an input signal $V_{in}$ on a line 144, and in response, provides an output signal $V_{out}$ on a line 146 to an electrical load 148.

The control circuit 134 receives the regulated voltage signals $V_{cc}$, $-V_{cc}$ on the lines 140, 142 along with the input signal $V_{in}$ on the line 144. According to the present invention, the control circuit 134 provides a feedback control signal on a line 150 which is used by the variable output power supply 132 to drive $V_{cc}$ and $-V_{cc}$ to values which maintain the power dissipated within the power operational amplifier circuit 136 at a relatively low value. Advantageously, this significantly increases the efficiency of the system since less power is dissipated within the power operational amplifier circuit 136. In addition, the present invention also increases power density.

Figure 5:
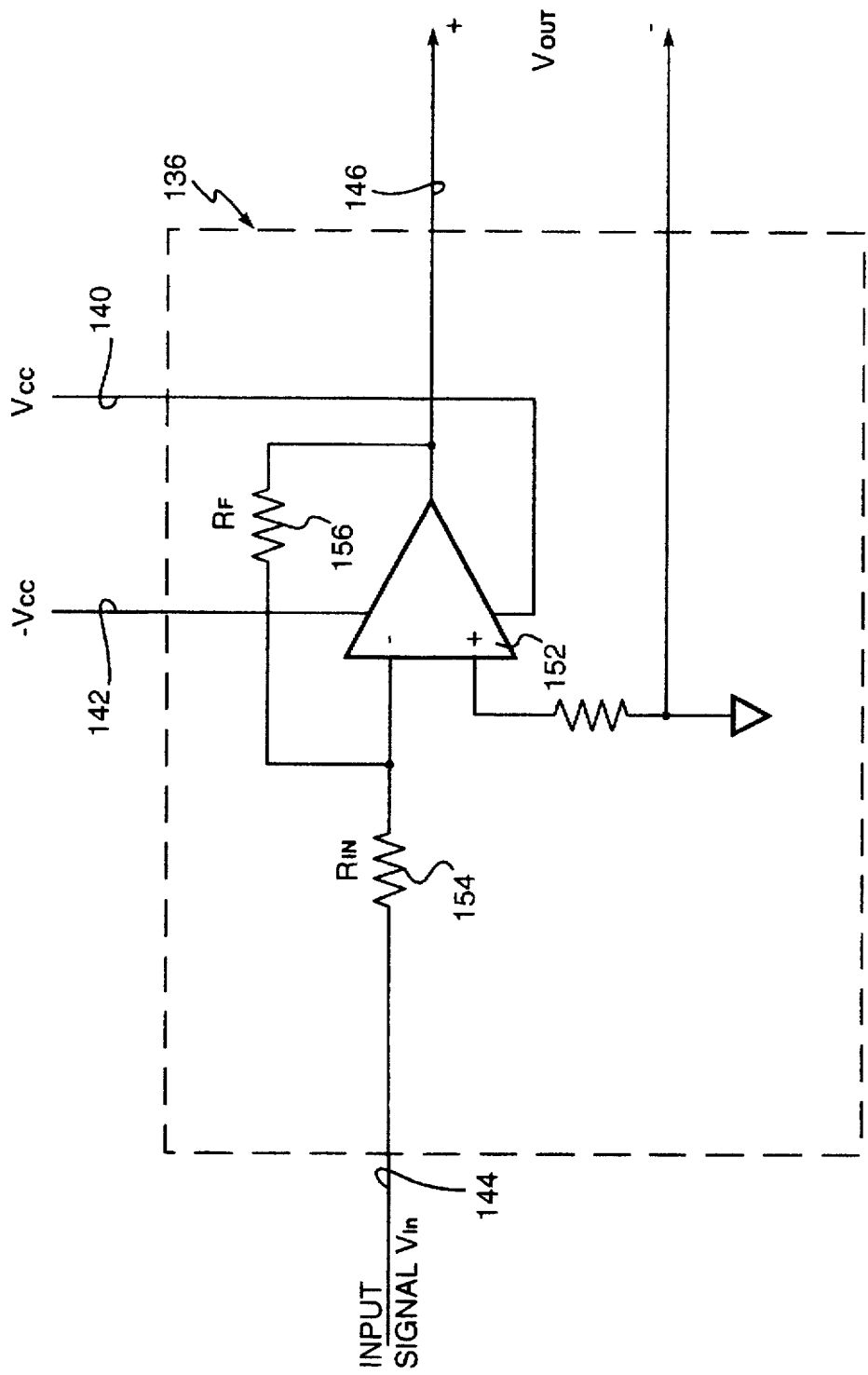
FIG. 5 is a schematic illustration of the power operational amplifier illustrated in FIG. 4.

FIG. 5 is a schematic illustration of the power operational amplifier circuit 136. The circuit 136 includes a power operational amplifier 152, and resistors $R_{in}$ and $R_f$, 154, 156 respectively, wherein the voltage gain of the circuit 136 is equal to $-(R_f/R_{in})$. An example of a power operational amplifier is the model LM675 operational amplifier available from National Semiconductor.

Figure 6:
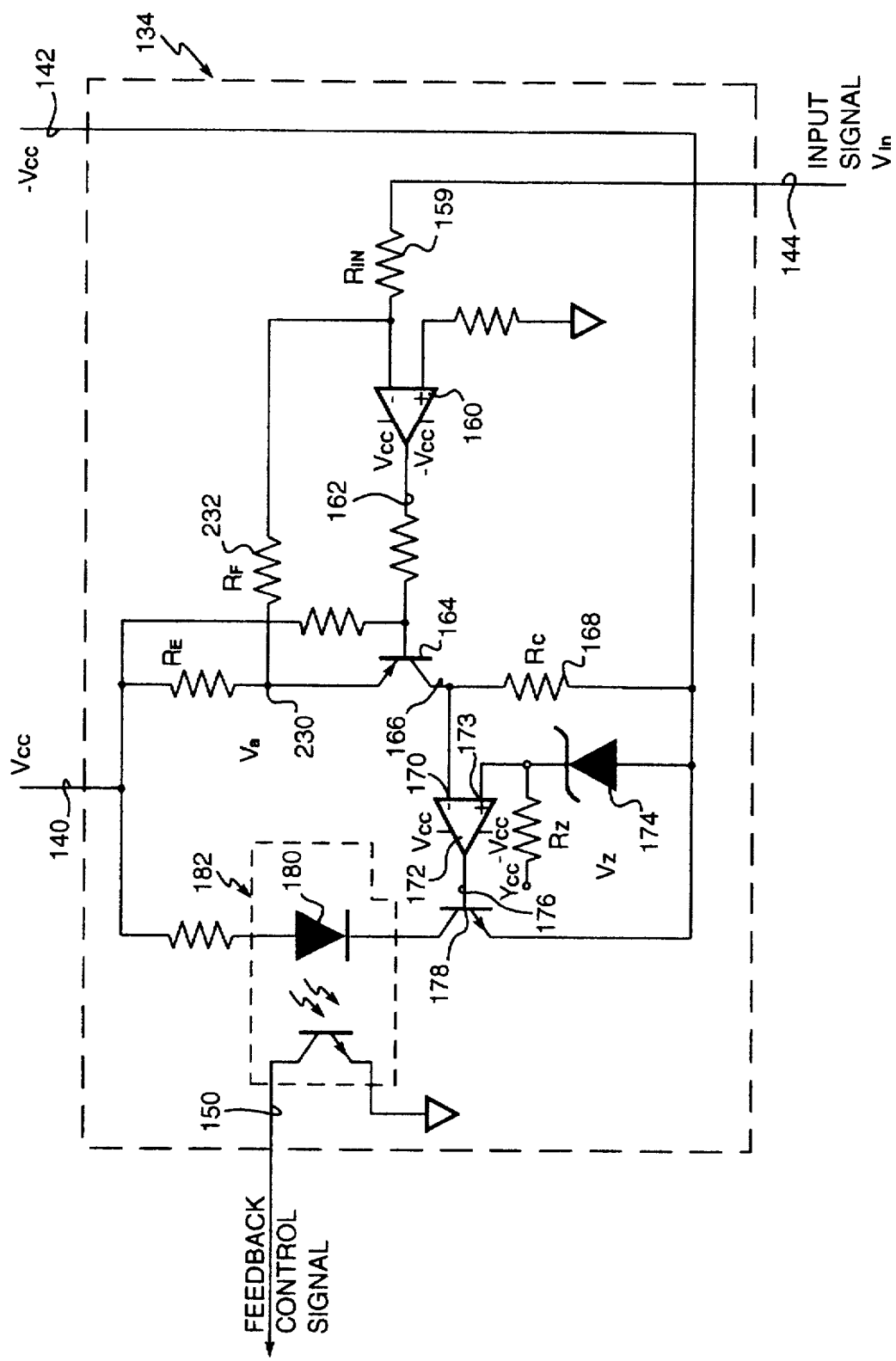
FIG. 6 is a schematic illustration of the control circuit of the alternative embodiment power amplifier illustrated in FIG. 4.

FIG. 6 is a schematic illustration of the control circuit 134. The circuit receives the input signal $V_{in}$ on the line 144, along with the regulated voltage signal values $V_{cc}$ and $-V_{cc}$ on the lines 140, 142, respectively. The input signal $V_{in}$ is input through a resistor $R_{in}$ 159 to an operational amplifier 160, which provides an output signal on a line 162 that controls the current through PNP transistor 164. Accordingly, this current establishes the voltage at node 166, and the voltage dissipated across resistor $R_c$ 168. The voltage present at node 166 is input to the inverting input 170 of an operational amplifier 172. The non-inverting input 173 of the amplifier 172 is connected to the cathode of zener diode 174. The anode of the zener diode is connected to the regulated voltage signal value $-V_{cc}$ on the line 142. The opamp comparator 172 provides an output signal on a line 176 which is input to the base of NPN transistor 178. The emitter of the transistor is connected to the regulated voltage signal value $-V_{cc}$ and the collector is connected to the cathode of photodiode 180 associated with opto-isolator 182. When the voltage on the line 176 is a diode forward voltage drop above the value of $-V_{cc}$, the base-emitter junction of the NPN transistor 178 is forward biased and current is allowed to follow through the photodiode 180.

Figure 7:
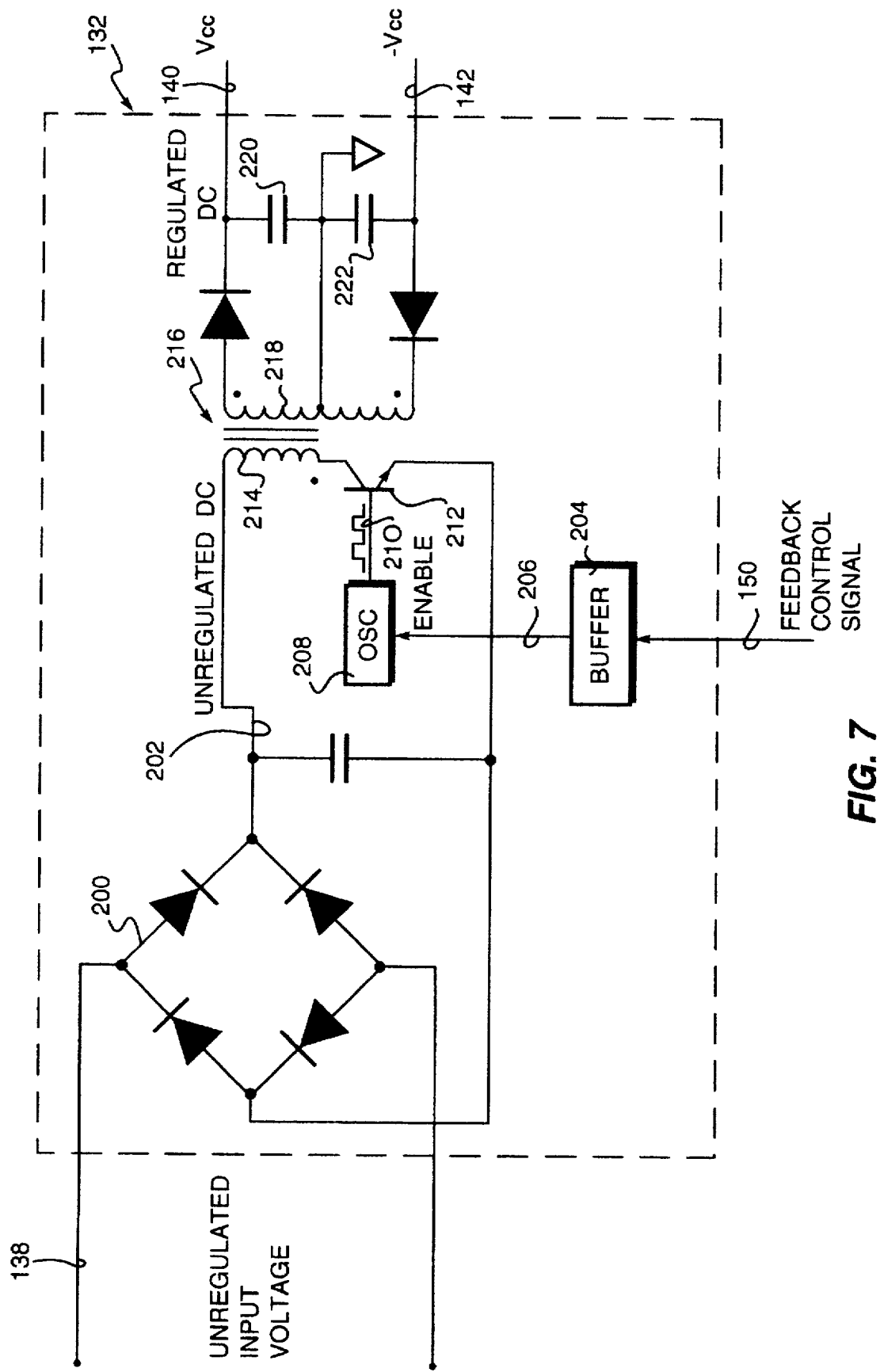
FIG. 7 is a schematic illustration of the variable output power supply associated with the alternative embodiment power amplifier illustrated in FIG. 4.

FIG. 7 is a block diagram of the variable output power supply 132. The supply includes a full wave diode rectifier 200 which provides an unregulated DC signal on a line 202. The supply also includes a buffer 204 which receives the feedback control signal on the line 150. Since the opto-isolator 182 illustrated in FIG. 6 is an open collector device, the buffer 204 includes a pull-up resistor (not shown). The buffer provides a control signal on a line 206 which is applied to an oscillator 208 which provides a pulsed periodic signal on a line 210 to the base of an NPN transistor 212. The pulse width of the pulsed periodic signal is set as a function of the control signal on the line 206, and the signal switches the transistor 212 between saturation and cut-off.

Switching the transistor 212 between saturation and cut-off induces a current through a primary winding 214 of a pulse transformer 216, which in turn establishes a voltage across the secondary windings 218 of the transformer. Capacitors 220, 222 attenuate the AC components of the resultant signal to provide the regulated DC voltage values $V_{cc}$ and $-V_{cc}$ on the lines 140, 142.

According to the present invention, the control circuit 134 (FIG. 6) and the variable output power supply 132 operate so the value of $V_{cc}$ is set as a function of $V_{out}$. In particular, in the embodiment illustrated in FIGS. 4–7, the relationship between $V_{cc}$ and $V_{out}$ is defined as:

$$V_{cc} = V_{out} + (R_e/R_c)*V_z \quad \text{(Eq. 1)}$$

Therefore, as $V_{out}$ varies in response to changes in $V_{in}$, $V_{cc}$ is varied according to Eq. 1. The values of $R_e$, $R_c$ and $V_z$ are selected to maintain a relatively low voltage drop across the operational amplifier circuit 136 (see FIG. 4). A brief explanation of how the control circuit 134 provides this relationship shall now be presented.

Referring to FIG. 6, if we assume $R_f$ is much greater than $R_e$ and $R_c$, and beta (i.e., β) of the transistor 164 approaches infinity, summing the currents at node 230 provides:

$$(V_{cc}-V_a)/R_e = V_z/R_c \quad \text{(Eq. 2)}$$

Summing the currents at the inverting input of the operational amplifier 160 provides:

$$V_a = -(R_f/R_{in})*V_{in} \quad \text{(Eq. 3)}$$

Using the expression for $V_a$ in Eq. 3, we can substitute for $V_a$ in Eq. 2, which yields:

$$(V_{cc}+(R_f/R_{in})*V_{in})/R_e = (V_z/R_c)*R_e \quad \text{(Eq. 4)}$$

Rewriting Eq. 4 in terms of $V_{cc}$, yields:

$$V_{cc} = (R_e/R_c)*V_z - (R_f/R_{in})*V_{in} \quad \text{(Eq. 5)}$$

According to Eq. 5, as $V_{in}$ increases or decreases, $V_{cc}$ will change in order to maintain the voltage drop across the power operational amplifier circuit 136 (FIG. 4) constant.

Referring to FIG. 5, the relationship between $V_{in}$ and $V_{out}$ can be expressed as:

$$V_{out} = -(R_f/R_{in})*V_{in} \quad \text{(Eq. 6)}$$

Using Eq. 6, we can rewrite Eq. 5 as follows:

$$V_{cc} = (R_e/R_c)*V_z + (R_f/R_{in})*(R_{ir}/R_f)*V_{out} \quad \text{(Eq. 7)}$$

Canceling terms, Eq. 7 can be rewritten as Eq. 1:

$$V_{cc} - V_{out} = (R_e/R_c)*V_z = \text{constant} \quad \text{(Eq. 1)}$$

Therefore, this derivation demonstrates that the high efficiency power amplifier 130 controls $V_{cc}$ in response to changes in $V_{out}$ to maintain the difference between $V_{cc}$ and $V_{out}$ equal to a predetermined constant value (e.g., 3 vdc). In contrast, as discussed earlier, prior art systems hold $V_{cc}$ constant, and drop large voltage values across the operational amplifier circuit to reduce the voltage to the desired output value.

It should be noted that in order for the product of the gain terms in Eq. 7 to equal unity, the gain associated with the operational amplifier 152 (FIG. 5) must be equal to the gain of the feedback amplifier 160 (FIG. 6). Specifically, referring to Eqs. 3 and 6 set forth above, $V_a$ must equal $V_{out}$. Therefore, as shown in FIGS. 5 and 6, the gain provided by resistors 154, 156 for the power operational amplifier 152 (FIG. 5), must equal the gain provided by resistors 159, 232 for the feedback operational amplifier 160.

Figure 8:
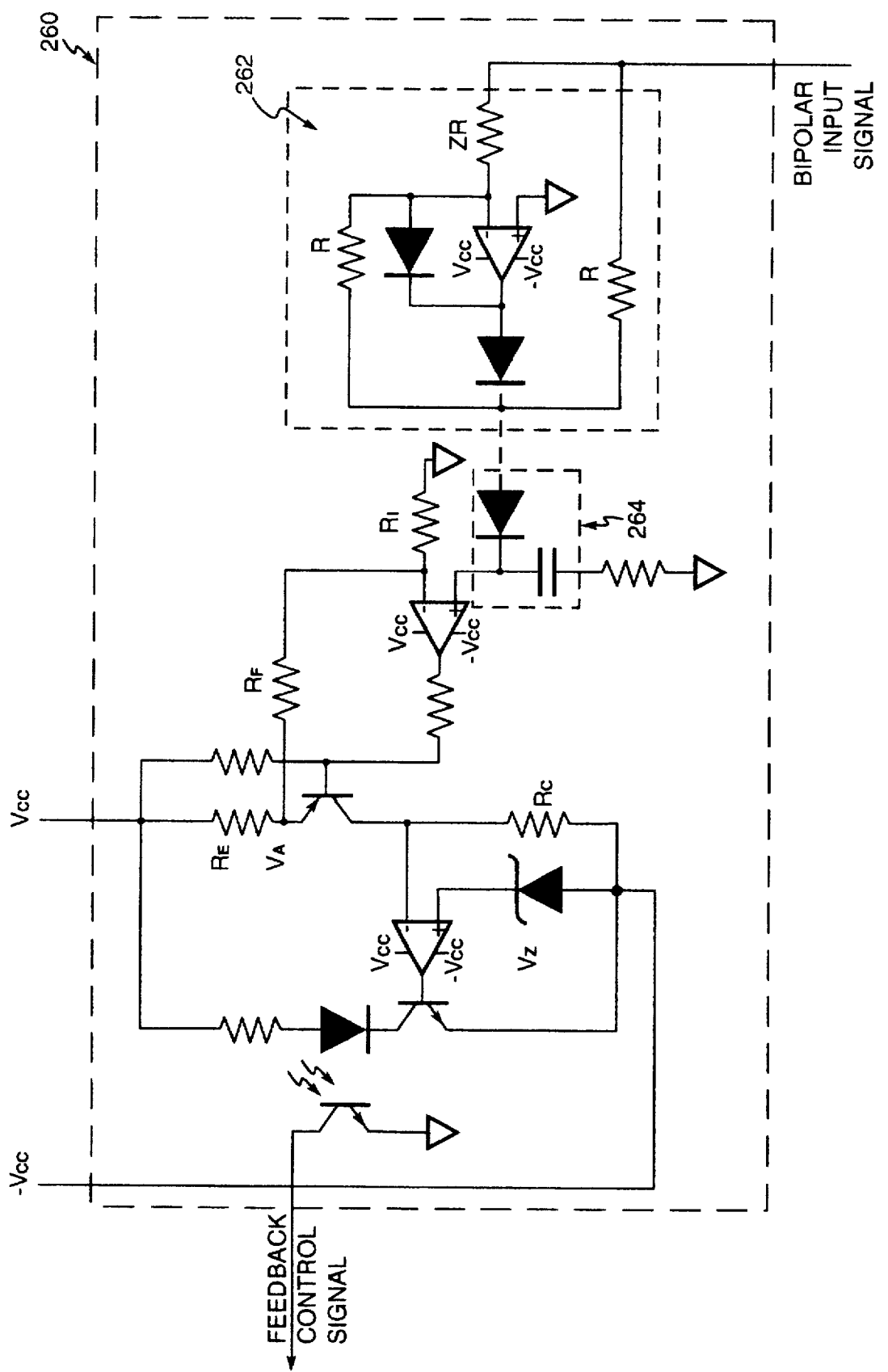
FIG. 8 is a schematic illustration of an alternative embodiment control circuit for use in a power amplifier system which receives a bipolar input signal $V_{in}$.

FIG. 8 is a schematic illustration of an alternative embodiment control circuit 260 for use in a high efficiency power amplifier system which receives a high frequency bipolar input signal $V_{in}$. This control circuit 260 is substantially the same as the control circuit illustrated in FIG. 6, with the exception that this circuit includes a full wave rectifier 262 and a peak detector circuit 264 in order to determine the peak of the bipolar input signal $V_{in}$. Note, if the frequency of the bipolar input signal is less than the closed loop cross-over frequency of the power amplifier system, the peak detector circuit is not required since the bandwidth of the amplifier is large enough to track the changes in $V_{in}$.

The feedback control technique of the present invention may also be used in a DC/AC converter.

Figure 9:
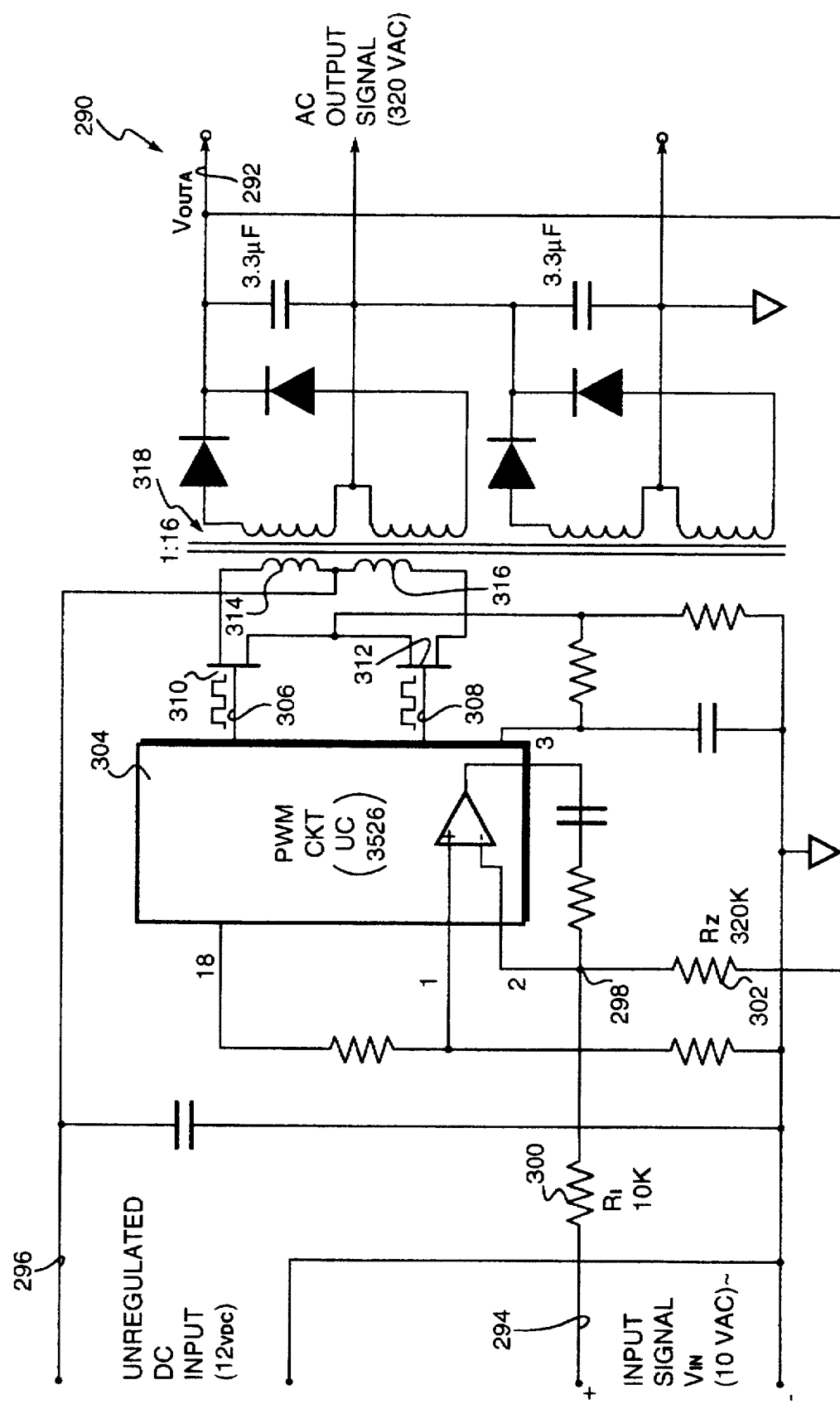
FIG. 9 is a schematic illustration of a DC/AC converter.

FIG. 9 is a schematic illustration of a DC/AC converter 290 (often referred as an "inverter") which also employs a feedback control circuit to generate an AC output signal $V_{out}$ on a line 292. The converter 290 receives an input signal $V_{in}$ (e.g., 10 vac) on a line 294, and an unregulated DC input signal (e.g., 12 vdc from a battery) on a line 296. The AC output signal $V_{out}$ and input signal $V_{in}$ are summed at a node 298 through resistors $R_1$ 300, $R_2$ 302, respectively. Summing the currents at node 298 indicates that $V_{out} = -(R_2/R_1)*V_{in}$. As shown, $R_1$ has a resistance of 10 Kohms while $R_2$ has a resistance of 320 Kohms, thus providing a gain of 32.

To provide the required system regulation, the converter 290 includes a pulse-width modulation (PWM) circuit 304 which provides switching control signals on lines 306, 308 to voltage controlled FET switches 310, 312, respectively. The PWM circuit 304 is available as a commercial off-the-shelf integrated circuit such as the model number UC 3526 available from Unitrode Corporation. The FET switches may include model number IRF540 available from Motorola.

The switching control signals on the lines 306, 308 control the operation of the FETs 310, 312, such that only one of these two FET switches is conducting at any given moment. The FET switches control the application of the unregulated DC input signal on the line 296 to primary windings 314, 316 of a transformer 318 having a turns ratio of at least 1:16 (i.e., sixteen secondary windings to each primary winding). Note, this turns ratio along with the number of secondary windings associated with each primary winding sets the open loop gain of the converter. The open loop gain for the converter illustrated in FIG. 9 is ideally thirty-two (32) since the turns ratio is 1:16 and there are two secondary windings.

It should be understood that the present invention is not limited to operating with a PWM regulator. Pulse frequency modulation (PFM) and pulse phase modulation (PPM) may also be used. It addition, it is contemplated that a current mode regulator may be used rather than the PWM voltage mode regulator. Furthermore, although the embodiments of the present invention disclosed herein employ an opto-isolator for feedback isolation, one of ordinary skill will appreciate that other isolation techniques may be used (e.g., a transformer), and that the system may even use a non-isolated feedback technique.

Furthermore, although the present invention has been discussed in the context of a boost topology, it should now be apparent to one of ordinary skill that the present invention may be used in other topologies such as buck, buck-boost, etc.

Although the present invention has been shown and described with respect to preferred embodiments thereof, it should be understood by those skilled in the art that various other changes, omissions and additions to the form and detail thereof, may be made therein without departing from the spirit and scope of the invention.

What is claimed is:

1. A power amplifier system, comprising:
   a variable output pulse modulated power supply which receives an unregulated voltage signal, and conditions and regulates said unregulated voltage signal to provide a regulated voltage signal value $V_{cc}$;
   an operational amplifier powered by said regulated voltage signal value $V_{cc}$ and responsive to an input signal value $V_{in}$, for providing an output signal value $V_{out}$ which is proportional to said input signal value $V_{in}$;
   a control circuit responsive to said regulated voltage signal value $V_{cc}$ and said input signal value $V_{in}$ for providing a feedback control signal; and
   wherein, said variable output pulse modulated power supply receives said feedback control signal, and in response thereto drives said regulated voltage signal value $V_{cc}$ to maintain the value $(V_{cc}-V_{out})$ equal to a predetermined value.

2. A power amplifier system, comprising:
   a variable output pulse modulated power supply which receives an unregulated voltage signal, and conditions and regulates said unregulated voltage signal to provide a regulated output signal value $V_{out}$ which is proportional to an input signal value $V_{in}$; and
   a control circuit responsive to said regulated output signal value $V_{out}$ and said input signal value $V_{in}$ for providing a feedback control signal indicative of the difference between $V_{out}$ and $V_{in}$;
   wherein, said variable output pulse modulated power supply receives said feedback control signal and in response thereto drives said regulated output signal value $V_{out}$ to maintain the relationship $(V_{out}=k*V_{in})$ where k is a constant value.

3. The power amplifier system of claim 1, wherein said variable output pulse modulated power supply includes a pulse width modulator.

4. The power amplifier system of claim 1, wherein said variable output pulse modulated power supply includes a pulse frequency modulator.

5. The power amplifier system of claim 1, wherein said variable output pulse modulated power supply includes a pulse phase modulator.

6. The power amplifier system of claim 2, wherein said variable output pulse modulated power supply includes a pulse width modulator.

7. The power amplifier system of claim 2, wherein said variable output pulse modulated power supply includes a pulse frequency modulator.

8. The power amplifier system of claim 2, wherein said variable output pulse modulated power supply includes a pulse phase modulator.

9. The power amplifier system of claim 1, wherein said input signal value $V_{in}$ is unipolar.

10. The power amplifier system of claim 1, wherein said input signal value $V_{in}$ is bipolar.

11. The variable output pulse modulated power supply of claim 1, wherein said variable output pulse modulated power supply includes
   a pulse modulator which receives said feedback control signal and provides a drive signal;
   a transformer comprising a primary winding and a secondary winding;
   means responsive to said drive signal for switching an unregulated DC voltage signal across said primary winding to establish an AC signal in said secondary winding; and
   a filter which rectifies said AC signal to provide said regulated voltage signal value $V_{cc}$.

12. The variable output pulse modulated power supply of claim 11, wherein said unregulated voltage signal is an AC signal, and said variable output pulse modulated power supply further comprises a diode bridge rectifier which receives said unregulated voltage signal and provides said unregulated DC voltage signal.

13. The variable output pulse modulated power supply of claim 1, wherein said unregulated voltage is a DC signal.

14. The power amplifier system of claim 2, wherein said input signal value $V_{in}$ is unipolar.

15. The power amplifier system of claim 2, wherein said input signal value $V_{in}$ is bipolar.

16. The variable output pulse modulated power supply of claim 2, wherein said variable output pulse modulated power supply includes
   a pulse modulator which receives said feedback control signal and provides a drive signal;
   a transformer comprising a primary winding and a secondary winding;
   means responsive to said drive signal for switching an unregulated DC voltage signal across said primary winding to establish an AC signal in said secondary winding; and a filter which rectifies said AC signal to provide said regulated output signal value $V_{out}$.

17. The variable output pulse modulated power supply of claim 16, wherein said unregulated voltage signal is an AC signal, and said variable output pulse modulated power supply further comprises a diode bridge rectifier which receives said unregulated voltage signal and provides said unregulated DC voltage signal.

18. The variable output pulse modulated power supply of claim 2, wherein said unregulated voltage is a DC signal.

* * * * *